United States Patent
Bolotov et al.

(10) Patent No.: US 9,553,612 B2
(45) Date of Patent: Jan. 24, 2017

(54) DECODING BASED ON RANDOMIZED HARD DECISIONS

(71) Applicant: Seagate Technology LLC, Cupertino, CA (US)

(72) Inventors: Anatoli A. Bolotov, San Jose, CA (US); Earl T. Cohen, Cupertino, CA (US); Elyar Gasanov, Moscow (RU); Mikhail I. Grinchuk, San Jose, CA (US); Pavel A. Panteleev, Moscow (RU)

(73) Assignee: Seagate Technology LLC, Cupertino, CA (US)

( * ) Notice: Subject to any disclaimer, the term of this patent is extended or adjusted under 35 U.S.C. 154(b) by 115 days.

(21) Appl. No.: 14/607,492

(22) Filed: Jan. 28, 2015

(65) Prior Publication Data

US 2015/0333776 A1 Nov. 19, 2015

(30) Foreign Application Priority Data

May 19, 2014 (RU) .................... 2014119848

(51) Int. Cl.
*H03M 13/00* (2006.01)
*H03M 13/45* (2006.01)
*H03M 13/15* (2006.01)

(52) U.S. Cl.
CPC ......... *H03M 13/451* (2013.01); *H03M 13/458* (2013.01); *H03M 13/152* (2013.01)

(58) Field of Classification Search
CPC .. H03M 13/458; H03M 13/451; H03M 13/45; H03M 13/152; H03M 13/453; H03M 13/29; G11C 29/04; G11C 11/5642; G11C 29/021; G11C 29/028; G11C 16/26; G11C 7/14; G11C 2029/0411; G06F 11/1048; G06F 11/1008; G06F 11/1068; H04L 1/0045; H04L 1/0057
See application file for complete search history.

(56) References Cited

U.S. PATENT DOCUMENTS

| 8,255,758 B2 * | 8/2012 | Anholt .............. G06F 11/1008 714/752 |
| 2002/0161560 A1 * | 10/2002 | Abe ....................... H04L 1/005 702/196 |
| 2004/0019842 A1 | 1/2004 | Argon et al. ................ 714/755 |

(Continued)

OTHER PUBLICATIONS

J. Wang, K. Vakilinia et al., "Enhanced Precision Through Multiple Reads for LDPC Decoding in Flash Memories", 2013, http://arxiv.org/abs/1309.0566.

(Continued)

*Primary Examiner* — Guerrier Merant
(74) *Attorney, Agent, or Firm* — Christopher P. Maiorana, PC

(57) ABSTRACT

An apparatus having a memory and a controller is disclosed. The memory is configured to store a codeword. The controller is configured to (i) determine one or more least-reliable bit positions in a soft-decision version of the codeword in response to failing to decode a hard-decision version of the codeword, (ii) generate a trial codeword by selecting at random a respective value in one or more trial positions among the least-reliable bit positions in the hard-decision codeword and (iii) perform a hard-decision decoding of the trial codeword.

20 Claims, 4 Drawing Sheets

(56) References Cited

U.S. PATENT DOCUMENTS

| | | | |
|---|---|---|---|
| 2004/0225940 A1* | 11/2004 | Kerr ................... | H03M 13/05 |
| | | | 714/752 |
| 2006/0020874 A1* | 1/2006 | Desai ................ | H03M 13/2963 |
| | | | 714/780 |
| 2011/0145681 A1 | 6/2011 | Yang ............................. | 714/773 |
| 2012/0005558 A1* | 1/2012 | Steiner ................ | G06F 11/1072 |
| | | | 714/773 |
| 2013/0238955 A1* | 9/2013 | D'Abreu ................ | G11C 29/04 |
| | | | 714/763 |
| 2014/0059401 A1 | 2/2014 | Chung et al. ................... | 714/752 |
| 2014/0143637 A1* | 5/2014 | Cohen ................ | H03M 13/1108 |
| | | | 714/773 |
| 2015/0149871 A1* | 5/2015 | Chen ................... | G06F 11/1068 |
| | | | 714/773 |

OTHER PUBLICATIONS

D. Chase, "A Class of Algorithms for Decoding Block Codes with Channel Measurement Information", IEEE Trans. on Inform. Theory, vol. IT-18, pp. 170-182, Jan. 1972.

William E. Ryan, Shu Lin "Channel Codes Classical and Modern", Cambridge University Press, New York, pp. 94-121, 2009.

\* cited by examiner

DECODING BASED ON RANDOMIZED HARD DECISIONS

This application relates to Russian Application No. 2014119848, filed May 19, 2014, which is hereby incorporated by reference in its entirety.

FIELD OF THE INVENTION

The invention relates to nonvolatile memory decoders generally and, more particularly, to a method and/or apparatus for implementing a decoding based on randomized hard decisions.

BACKGROUND

In modern read channels for flash memories, hard-decision information and soft-decision information can be provided for each stored bit. Some conventional error correcting codes utilize the soft-decision information to aid in recovering the bits. However, the soft-decision codes usually have error floors (i.e., a less-steep bit-error-rate curve in a high signal-to-noise region) due to relatively small minimum distances and trapping sets. The error floors create problems in storage applications where specified output bit-error rates are commonly small. Conventional algebraic codes use only the hard-decision information and do not suffer from the error floors. However, the algebraic codes have a bit-error-rate performance loss in a waterfall region (i.e., a low signal-to-noise region) compared with the soft-decision information-based codes.

SUMMARY

The invention concerns an apparatus having a memory and a controller. The memory is configured to store a codeword. The controller is configured to (i) determine one or more least-reliable bit positions in a soft-decision version of the codeword in response to failing to decode a hard-decision version of the codeword, (ii) generate a trial codeword by selecting at random a respective value in one or more trial positions among the least-reliable bit positions in the hard-decision codeword and (iii) perform a hard-decision decoding of the trial codeword.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a decoding based on randomized hard decisions that may (i) implement an iterative decoding that incorporates a hard-decision decoding technique, (ii) randomly adjust a test pattern between iterations, (iii) randomly adjust unreliable bits in a codeword, (iv) use soft-decoding information to produce the test patterns and/or (v) be implemented as one or more integrated circuits.

Embodiments of the invention provide a soft-decision information-based, multi-round decoding technique that can be used, for example, in modern nonvolatile memory (e.g., flash) read channels. The technique is applicable to any environment where the soft-decision information is available, for example hard disk drives. The decoding technique is generally implemented as a wrapper around a hard-decision decoder for any error correcting code. The hard-decision decoders generally include, but are not limited to Bose-Chaudhuri-Hocquenghem (e.g., BCH) decoders, Reed-Solomon (e.g., RS) decoders, and/or low density parity check (e.g., LDPC) decoders. The decoding is performed in one or more rounds. An initial round attempts to decode the possibly erroneous codeword as read from the nonvolatile memory. If the initial round fails, one or more selected unreliable positions (e.g., positions with small log-likelihood ratio (e.g., LLR) values) are identified in each subsequent round. For each selected unreliable position, the corresponding log-likelihood ratio value is transformed into a logical zero and/or logical one probability distribution. The probability distributions are used to randomly and independently produce trial hard decisions (or bits) for the selected unreliable positions. For all other (e.g., reliable) positions, standard hard decisions are applied. A hard-decision decoding of the modified codeword is subsequently attempted. The iterative procedure continues until either the hard-decision decoder converges or a maximum number of the rounds is reached. The iterations stop if the current round successfully decodes the current codeword. The decoding is considered to fail where an end condition (e.g., a maximum number of rounds have been completed without a successful decode) is reached.

In further embodiments in which the hard-decision decoder is enabled to utilize erasure information, the probability distributions for the selected unreliable positions include, either explicitly or implicitly, a probability of erasing the selected unreliable position.

Figure 1:
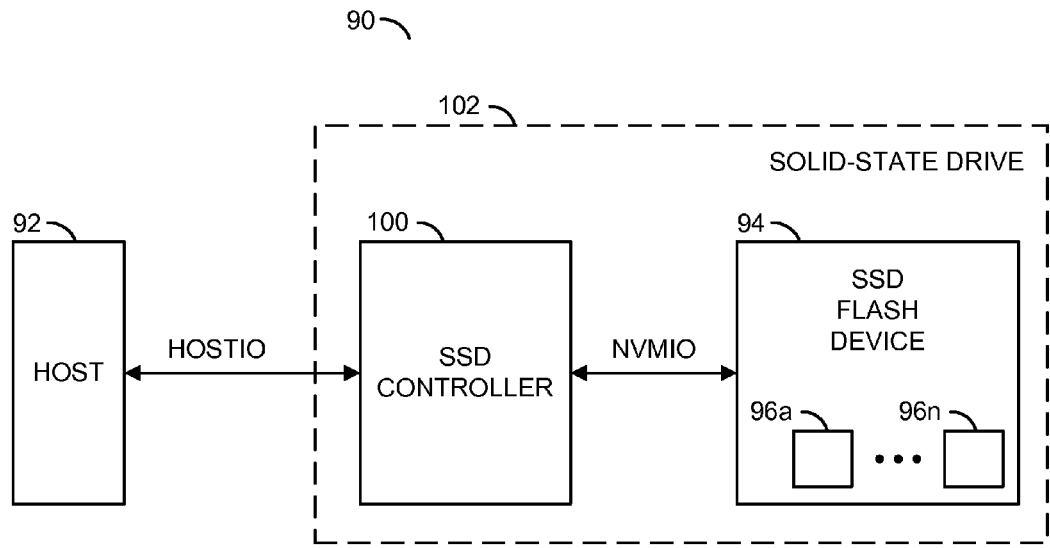
FIG. 1 is a block diagram of an apparatus.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94, one or more blocks (or circuits) 96a-96n and a block (or circuit) 100. The circuits 94 and 100 form a drive (or device) 102. The circuits 92 to 102 may be represented as modules and/or blocks, embodiments of which include hardware (circuitry), code (e.g., hardware description languages (HDLs) such as register-transfer level (RTL), Verilog, etc.) used by one or more electronic design tools, computer executable code in a storage device, software and associated hardware executing the software, and/or other implementations.

One or more signals (e.g., HOSTIO) are exchanged between the circuit 92 and the circuit 100. The host input/output signal HOSTIO generally includes, but is not limited to, a logical address component used to access data in the circuit 102, a host command component that controls the circuit 102, a write data component that transfers write data from the circuit 92 to the circuit 100 and a read data component that transfers error corrected read data from the circuit 100 to the circuit 92. One or more signals (e.g., NVMIO) are exchanged between the circuit 100 and the circuit 94. The nonvolatile memory input/output signal NVMIO generally includes, but is not limited to, a physical address component used to access data in the circuit 94, a memory command component that controls the circuit 94 (e.g., read or write commands), a write codeword component that carries error correction coded and cyclical redundancy check protected write codewords written from the circuit 100 into the circuit 94 and a read codeword component that carries the error correction coded codewords read from the circuit 94 to the circuit 100.

The circuit 92 is shown implemented as a host circuit. The circuit 92 is generally operational to read and write data to and from the circuit 94 via the circuit 100. When reading or writing, the circuit 92 transfers a logical address value in the signal HOSTIO to identify which set of data is to be written or to be read from the circuit 94. The address generally spans a logical address range of the circuit 102. The logical address can address individual data units, such as SATA (e.g., serial-ATA) sectors.

The circuit 94 is shown implementing one or more nonvolatile memory circuits (or devices) 96a-96n. According to various embodiments, the circuit 94 comprises one or more nonvolatile semiconductor devices. The circuit 94 is generally operational to store data in a nonvolatile condition. When data is read from the circuit 94, the circuit 94 accesses a set of data (e.g., multiple bits) identified by the address (e.g., a physical address) in the signal NVMIO. The address generally spans a physical address range of the circuit 94.

Data within the circuit 94 is generally organized in a hierarchy of units. A block is a smallest quantum of erasing. A page is a smallest quantum of writing. A codeword (or read unit or Epage or ECC-page) is a smallest quantum of reading and error correction. Each block includes an integer number of pages. Each page generally includes an integer number of codewords. In some embodiments, codewords are enabled to span a page boundary of a multi-page unit. For example, some nonvolatile memory types are organized in planes that are operable in parallel, each plane comprising a plurality of the blocks. A multi-page unit, selected as a page from each plane, is thus writeable and readable as a single unit.

The circuits 96a-96n are generally implemented as NAND flash memory, NOR flash memory, flash memory using polysilicon or silicon nitride technology-based charge storage cells, two-dimensional or three-dimensional technology-based nonvolatile memory, ferromagnetic memory, phase-change memory, racetrack memory, resistive random access memory, magnetic random access memory and similar types of memory devices and/or storage media. Other nonvolatile memory technologies may be implemented to meet the criteria of a particular application.

In some embodiments, the circuits 96a-96n may be implemented as a single-level cell (e.g., SLC) type circuits. A single-level cell type circuit generally stores a single bit per memory cell (e.g., a logical 0 or 1). In other embodiments, the circuits 96a-96n may be implemented as a multi-level cell type circuits. A multi-level cell type circuit is capable of storing multiple (e.g., two) bits per memory cell (e.g., logical 00, 01, 10 or 11). In still other embodiments, the circuits 96a-96n may implement a triple-level cell type circuits. A triple-level cell circuit stores multiple (e.g., three) bits per memory cell (e.g., a logical 000, 001, 010, 011, 100, 101, 110 or 111). A four-level cell type circuit may also be implemented. The examples provided are based on two bits per cell type devices and may be applied to all other types of nonvolatile memory.

The circuit 100 is shown implementing a controller circuit. The circuit 100 is generally operational to control reading to and writing from the circuit 94. The circuit 100 includes an ability to decode the read codewords received from the circuit 94. The resulting decoded data is presented to the circuit 92 via the signal HOSTIO and/or re-encoded and written back into the circuit 94 via the signal NVMIO. The circuit 100 comprises one or more integrated circuits (or chips or die) implementing the controller of one or more solid-state drives, embedded storage, or other suitable control applications.

As part of the decoding, the circuit 100 receives a codeword (possibly with errors) from the circuit 94. The circuit 100 determines one or more least-reliable bit positions in a soft-decision codeword version of the codeword in response to failing to decode a hard-decision codeword version of the codeword. A trial codeword is generated by selecting at random a respective value in one or more trial positions among the least-reliable bit positions in the hard-decision codeword. A hard-decision decoding of the trial codeword is subsequently performed.

The circuit 102 is shown implementing a solid-state drive. The circuit 102 is generally operational to store data generated by the circuit 92 and return the data to the circuit 92. According to various embodiments, the circuit 102 comprises one or more: nonvolatile semiconductor devices, such as NAND Flash devices, phase change memory (e.g., PCM) devices, or resistive RAM (e.g., ReRAM) devices; portions of a solid-state drive having one or more nonvolatile devices; and any other volatile or nonvolatile storage media. The circuit 102 is generally operational to store data in a nonvolatile condition.

Figure 2:
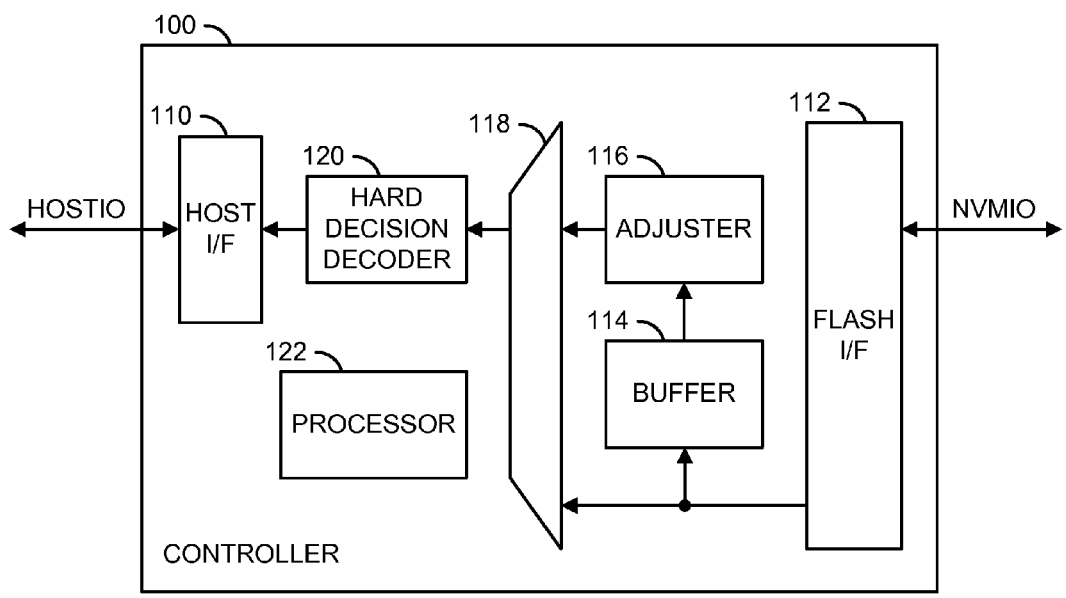
FIG. 2 is a block diagram of a controller in accordance with an embodiment of the invention.

Referring to FIG. 2, a block diagram of an example implementation of the circuit 100 is shown in accordance with an embodiment of the invention. The circuit 100 generally comprises a block (or circuit) 110, a block (or circuit) 112, an optional block (or circuit) 114, a block (or circuit) 116, a block (or circuit) 118, a block (or circuit) 120 and a block (or circuit) 122. The circuits 110 to 122 may be represented as modules and/or blocks, embodiments of which include hardware (circuitry), code (e.g., hardware description languages (HDLs) such as register-transfer level (RTL), Verilog, etc.) used by one or more electronic design tools, computer executable code in a storage device, software and associated hardware executing the software, and/or other implementations.

The circuit 110 is shown implemented as a host interface circuit. The circuit 110 is operational to provide communication with the circuit 92 via the signal HOSTIO. Other signals may be implemented between the circuits 92 and 110 to meet the criteria of a particular application.

The circuit 112 is shown implemented as a nonvolatile memory (e.g., flash) interface circuit. The circuit 112 is operational to provide communication with the circuit 94 via the signal NVMIO. Other signals may be implemented between the circuits 94 and 112 to meet the criteria of a particular application.

The circuit 114 is shown implemented as a buffer circuit. The circuit 114 is operational to buffer codewords received from the circuit 94 via the circuit 112. The circuit 114 also buffers soft-decision information (e.g., log-likelihood ratios) generated by the circuit 122. The read codewords and the soft-decision information are presented from the circuit 114 to the circuit 116. The circuit 114 is operational to present soft-decision versions and hard-decision versions of the codewords to the circuit 116.

The circuit 116 is shown implemented as an adjuster circuit. The circuit 116 is operational to generate trial codewords by adjusting one or more bits in hard-decision versions of the codewords in search of corrections that enable the circuit 120 to successfully decode the codewords. For each codeword, the circuit 116 determines one or more least-reliable bit positions in a soft-decision version of the codeword received from the circuit 114 in response to the circuit 120 failing to decode the hard-decision version of the codeword. The circuit 116 is also operational to generate a trial codeword version of the codeword by selecting at random (e.g., by a weighted coin flip) a respective value in one or more trial positions among the least-reliable bit positions in the hard-decision codeword. According to various embodiments, the weighting is based on one or more of: the logical zero and/or logical one probability distributions; log-likelihood ratios; known and/or measured voltage distributions of the nonvolatile memory; historical/tracked information of past reads; environmental factors such as temperature; aging properties of the nonvolatile memory, such as a program/erase cycle count; and other similar measures and/or metrics.

The circuit 118 is shown implemented as a multiplexer circuit. The circuit 118 is operational to route the hard-decision codewords from the circuit 112 in each initial attempt to decode the codewords. The circuit 118 routes the trial codewords from the circuit 116 to the circuit 120 in subsequent iterations of the decoding operations.

The circuit 120 is shown implemented as a hard-decision decoder circuit. The circuit 120 is operational to perform a hard-decision decoding of hard-decision codewords received from the circuit 112 and the trial codewords received from the circuit 116. In some embodiments, the circuit 120 is implemented as one or more (i) low density parity check decoder circuits, (ii) Bose-Chaudhuri-Hocquenghem decoder circuits and (iii) Reed-Solomon decoder circuits. Other types of hard-decision decoder circuits may be implemented to meet the criteria of a particular application.

The circuit 122 is shown implemented as a processor circuit. The circuit 122 is operational to command and/or assist with the multiple read/write requests and to control one or more reference voltages used in the circuit 94 to read the codewords. In various embodiments, the circuit 122 is operational to calculate the soft-decision information used by the circuit 116. For some types of nonvolatile memory, the soft-decision information is generated based on one or more reads of a given codeword from the circuit 94 at different reference voltages. Other types of flash memory are able to provide a form of the soft-decision information directly, such as a coarse (e.g., 3-bit resolution) voltage-level for each bit position. The soft-decision information is stored in the circuit 114.

In various embodiments of flash memory read channels, sense amplifier comparators provide a single bit of read information for each stored bit. Thus, the circuit 120 can decode with hard decisions on each bit. Some embodiments of the flash memory read channels provide soft-decision information for each read bit. The soft-decision information can be obtained either by reading from the same sense amplifier comparators multiple times or by equipping each flash memory cell with many sense amplifier comparators. In both cases, the soft-decision information is usually represented in the form of the log-likelihood ratio values according to formula (1) as follows:

$$L=\ln(P_0/P_1) \tag{1}$$

Where $P_0$ is a probability that the stored bit is a logical zero (e.g., "0") and $P_1$ is a probability that the stored bit is a logical one (e.g., "1"). Since $P_0+P_1=1$, values of $P_0$ and $P_1$ can be calculated per formula (2) as follows:

$$P_0=e^L/(e^L+1), P_1=1/(e^L+1) \tag{2}$$

If $L<0$, then $P_1>P_0$ and the logical one value is more probable than the logical zero value. If $L>0$, then $P_1<P_0$ and the logical zero value is more probable than the logical one value. Furthermore, if the value L is the same as or close to 0 (zero), each probability $P_0$ and $P_1$ is the same as or close to ½ (one-half). Similar probabilities mean that the corresponding bit is unreliable (e.g., the bit can be a logical zero or a logical one with similar probabilities). An absolute value |L| is called a reliability of the stored bit. Therefore, a stored bit b can be reconstructed from the log-likelihood ratio value L by a hard decision according to formula (3) as follows:

$$b = \begin{cases} 1, & \text{if } L < 0 \\ 0, & \text{if } L > 0 \\ 0 \text{ or } 1, & \text{if } L = 0 \end{cases} \tag{3}$$

whether to use "0" or "1" in the third case of formula 3 depends on the particular implementation. In some embodiments, where the hard-decision decoder is enabled to perform erasure decoding, values of L close to zero are erased rather than being forced to "0" or to "1". In various real applications, only a finite set of quantized log-likelihood ratio values can be used. The finite set of quantized log-likelihood ratio values is generally referred to as a quantized log-likelihood ratio set. The more elements that exist in the quantized log-likelihood ratio set, the better precision of the log-likelihood ratios.

In some embodiments, the "coin-flipping" (e.g., randomization) part of the circuit 116 uses multiple reads from the circuit 94 and/or the circuit 94 has a direct soft-decision output signal. The coin-flipping is based on the soft-decision information. A hard-decision decode is initially performed by the circuit 120 directly from a single read of the circuit 94. The results of the single read, and subsequent reads, may be buffered in the circuit 114 and processed by the circuit 122 to generate the soft-decision information and other information used by the rest of the decoding technique. Various embodiments may not include the circuit 114. In such embodiments, after an initial hard-decision read, another read of the circuit 94 provides the soft-decision information.

The iterative decoding techniques use the soft-decision information in order to form a collection of test patterns (or error correction patterns), iteratively apply the test patterns one-by-one to the received codeword, and subsequently run an algebraic decoder. If the algebraic decoder converges to an error-free codeword in a current iteration, the final (successfully decoded) codeword is the result of the current test (or trial) pattern. If the algebraic decoder fails, a next iterative round is initiated and a next test pattern is applied to the codeword. If all the rounds are not successful, the iterative decoding has failed. A complexity (e.g., run-time) of the iterative decoding depends on the number of test patterns. Thus, a relatively small number of test patterns are generally used in applications with decoding-time constraints.

Some embodiments of the circuit 100 consider two commonly used Chase decoding techniques. A technique, known as "Chase-3", uses test patterns that contain s logical ones located in the s least reliable positions for s=0, 2, 4, ..., 2t, where t is the error correcting capability of the code. Another technique, referred to as an "m-least-Chase", finds m least-reliable positions and uses all possible combinations of the logical zeros and the logical ones in the positions as test patterns.

Operation of the circuit 100 is discussed by way of example involving an (n,k)-code C (e.g., a BCH code), a codeword $c=(c_1, \ldots, c_n)$ sent through a channel, and a log-likelihood ratio vector $(L_1, \ldots, L_n)$ received through the channel. The channel may be a flash memory read channel of the circuit 94. Other channels that provide soft-decision information may be implemented to meet the criteria of a particular application.

Define a constant $\theta>0$ as a reliability threshold. A position $i\in\{i_1, \ldots, i_s\}$ in the codeword c is considered unreliable if $|L_i|\leq\theta$. Otherwise, the position is considered reliable. Let $i_1 < \ldots < i_s$ be all the unreliable positions in the codeword c in the ascending order of reliability. A hard-decision decoding technique is generally fixed for the code C. A round of the coin-flipping decoding technique, in some embodiments, generally comprises the following steps. For each unreliable position $i\in\{i_1, \ldots, i_s\}$, convert the corresponding log-likelihood ratio value $L_i$ into the probabilities $P_0^{(i)}, P_i^{(i)}$ of logical zero and logical one by formula (2). Use $P_0^{(i)}, P_1^{(i)}$ to randomly and independently, for each unreliable position $i\in\{i_1, \ldots, i_s\}$, generate hard decisions per formula (4) as follows:

$$L_i = \ln\frac{P_1^{(i)}}{P_0^{(i)}} \to (P_0^{(i)}, P_1^{(i)}) \to \begin{cases} 0, \text{ with probability } P_0^{(i)} \\ 1, \text{ with probability } P_1^{(i)} \end{cases} \quad (4)$$

Use the standard hard decisions (e.g., formula (3)) for all other (reliable) positions. Afterwards, run the hard-decision decoding technique on the resulting adjusted binary vector. In other embodiments, formula (4) is extended to include a probability of erasing zero or more of the unreliable positions, according to a magnitude of Li.

Figure 3:
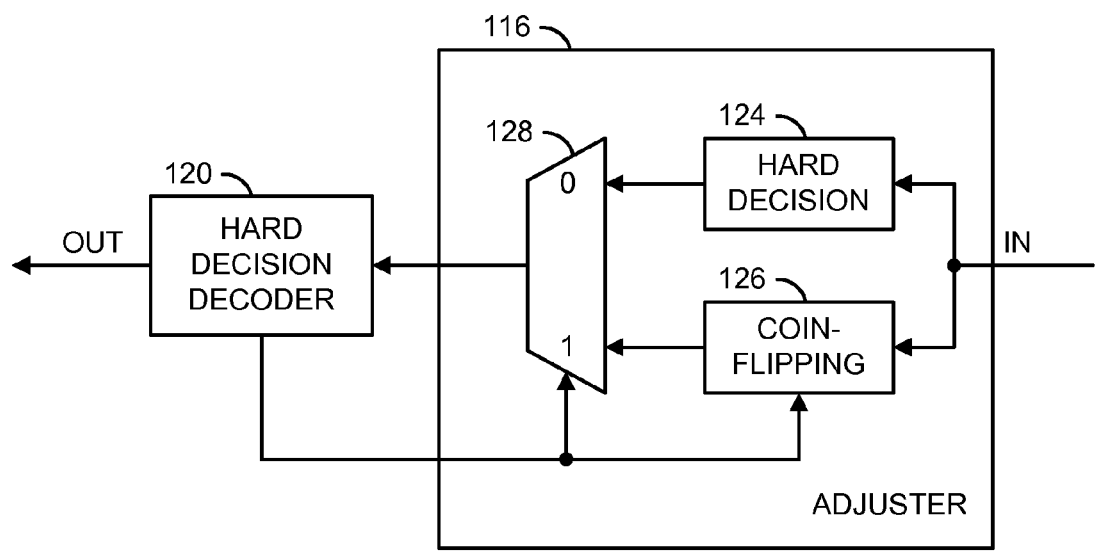
FIG. 3 is a block diagram of an adjuster circuit.

Referring to FIG. 3, a block diagram of an example implementation of the circuit 116 is shown. The circuit 116 generally comprises a block (or circuit) 124, a block (or circuit) 126 and a block (or circuit) 128. The circuits 124 to 128 may be represented as modules and/or blocks, embodiments of which include hardware (circuitry), code (e.g., hardware description languages (HDLs) such as register-transfer level (RTL), Verilog, etc.) used by one or more electronic design tools, computer executable code in a storage device, software and associated hardware executing the software, and/or other implementations.

The circuit 124 is shown implementing a hard-decision circuit. The circuit 124 is operational to identify the reliable bits of the hard-decision codeword received from the circuit 114. The reliable bits are transferred unaltered to the circuit 120 via the circuit 128.

The circuit 126 is shown implementing a coin-flipping circuit. The circuit 126 is operational to determine the least-reliable bit positions in the soft-decision version of the codeword received from the circuit 114. The circuit 126 is also operational to generate a trial codeword by selecting at random a respective value in each trial position among the least-reliable bit positions in the hard-decision version of the codeword received from the circuit 114. The circuit 126 receives pass/fail feedback generated by the circuit 120.

Failed feedback causes the circuit 126 to generate another test pattern for one or more of the least-reliable bit positions. The trial positions may be one or more, up to all of the least-reliable bit positions. In some embodiments, the circuit 116 includes a counter that is initialized at an initial one of the trials, and increments for each subsequent unsuccessful trial. Circuit 126 is enabled to use the counter as an input to the trial codeword generation. In an example, the threshold $\theta$ is increased in subsequent trials. In another example, erasures are only enabled to be used after a specified number of unsuccessful trials without erasures.

The circuit 128 is shown implementing a multiplexer circuit. The circuit 128 is operational to route the reliable bits from the circuit 124 to the circuit 120. The circuit 128 routes the adjusted trial bits from the circuit 126 to the circuit 120. Control of the routing is generally determined by the circuit 120.

In various embodiments, the main decoding technique can be implemented as a wrapper around the hard decision decoder D (e.g., the circuit 120) for the code C. The decoding technique performs the following steps. The circuits 124 and 126 read the input log-likelihood ratio vector $(L_1, \ldots, L_n)$ from the circuit 114. The circuits 124 and 126 make the hard-decisions by formula (3) and formula (4) respectively for all positions. The circuit 120 subsequently tries to decode the resulting trial codeword using the hard-decision decoder D. If the hard-decision decoder D converges to some (error free) codeword, the technique successfully stops with the decoded codeword as the result. If the current decoding iteration fails, the coin-flipping rounds are repeated by the circuits 124 and 126 and the hard-decision decoding is repeated by the circuit 120 until the decoding is successful or the maximal number of coin-flipping rounds (e.g., M) is reached.

A number of hard-decision decoder D runs are upper-bounded by M+1. Thus, an overall decoding complexity of the coin-flipping decoding depends on a maximum number (e.g., an end condition) of coin-flipping rounds M. For some types of algebraic decoders (e.g., for BCH decoders), some calculations are shared between different runs of the hard-decision decoder D, such as syndrome calculations. Hence, the overall decoding complexity of the coin-flipping decoder may be smaller than the hard-decision decoder D complexity times the value (M+1).

In some embodiments, a fixed upper bound (or threshold) on a number of unreliable positions used in a round of decoding is established. Instead of coin-flipping all positions i with $|L_i|\leq\theta$, the log-likelihood ratio values are sorted by absolute values $|L_{i1}|\leq|L_{i2}|\leq \ldots \leq|L_{in}|$. The coin-flipping is applied for a predetermined number (e.g., m) of least unreliable positions $i_1, \ldots, i_m$. The fixed upper bound approach is generally referred to as "m-least-CF decoding".

In other embodiments, m positions among the unreliable positions i with $|L_i|\leq\theta$ are randomly chosen and the corresponding hard-decision bits are flipped (e.g., change zeros to ones and vice versa) deterministically. The random position approach is generally referred to as "m-rand-CF".

Let s be a total number of unreliable positions in the codeword. Besides the m-least-CF technique and the m-rand-CF technique, the probabilistic coin-flipping technique can be combined with the deterministic Chase decoding (e.g., in the circuit 120) in a number of different ways. For example, if s is much smaller than m, a threshold X is selected such that if s≤x, just use the s-least-Chase decoding technique.

In various embodiments, if s>m, one or more of the modifications of the coin-flipping technique are applied to the overall decoding. For example, initially after a hard-decision failure, adjust the threshold θ so that s approximately matches m. Adjusting the threshold θ dynamically chooses the threshold for coin-flipping based on decoding time constraints. The threshold θ is generally limited to be not so large as to perform the coin-flipping on more-certain values.

The threshold θ can also be adjusted over multiple iterations. Start with a smaller threshold $θ_1$, perhaps chosen to get a certain minimum value of s. If some number of iterations at that level does not succeed, increase the threshold θ (up to some maximum) and keep iterating.

A distribution of the log-likelihood ratio values can be examined and two thresholds $θ_1$ and $θ_2$ established. If m indicates a small number (e.g., m≤X) of very unreliable positions i with $|L_i|≤θ_1$, the m-least-Chase technique can be applied to the m positions, and subsequently fall back to coin-flipping on the full $θ_2$ region.

In some embodiments, the codeword positions can be sorted by the corresponding reliabilities $|L_{N1}|≤|L_{N2}|≤ . . . ≤|L_{Nn}|$ and constants α and β established. Values $v_i=α×N_i+β|L_i|$ are calculated. For each i=1, 2, . . . , n, if $v_i>½$, use the standard hard decisions given by formula (3). If $v_i≤½$, use the coin-flipping given by formula (4), where $p_1^{(Ni)}=max(0, ½−v_i)$, $P_0^{(Ni)}=1−P_1^{(Ni)}$.

Simulations were conducted on the coin-flipping technique and several common decoding techniques. The results were obtained in a 4-value multi-level cell flash memory read channel software model (e.g., each cell stores two bits). A (18548, 17408) BCH code was applied with the number of errors t=76 and a standard bounded distance decoder as a hard decision decoder. The reliability threshold A was set to 0.7. Experimental data shows that the reliability threshold value 0.7 is well suited for some flash memory read channels.

A manually created quantized log-likelihood ratio set (e.g., ±∞, ±0.7, ±0.5, ±0.4, ±0.3, ±0.2, ±0.1, 0) was used in the simulations. The manual set of log-likelihood ratio values was found during extensive simulation experimentation of a selected flash memory read channel model. In all experiments, only a most significant bit (of multiple bits per cell) read channel was considered. The simulations were performed on coin-flipping decoders with several modifications: 64-least-CF (m=64) and 10-rand-CF (m=10). All techniques were used with a maximum number of coin-flipping rounds M=16. The coin-flipping techniques were also compared with the standard hard-decision BCH technique, the 4-least-Chase (16 test patterns), the 10-least-Chase (1024 test patterns), and the Chase-3 decoding technique.

Figure 4:
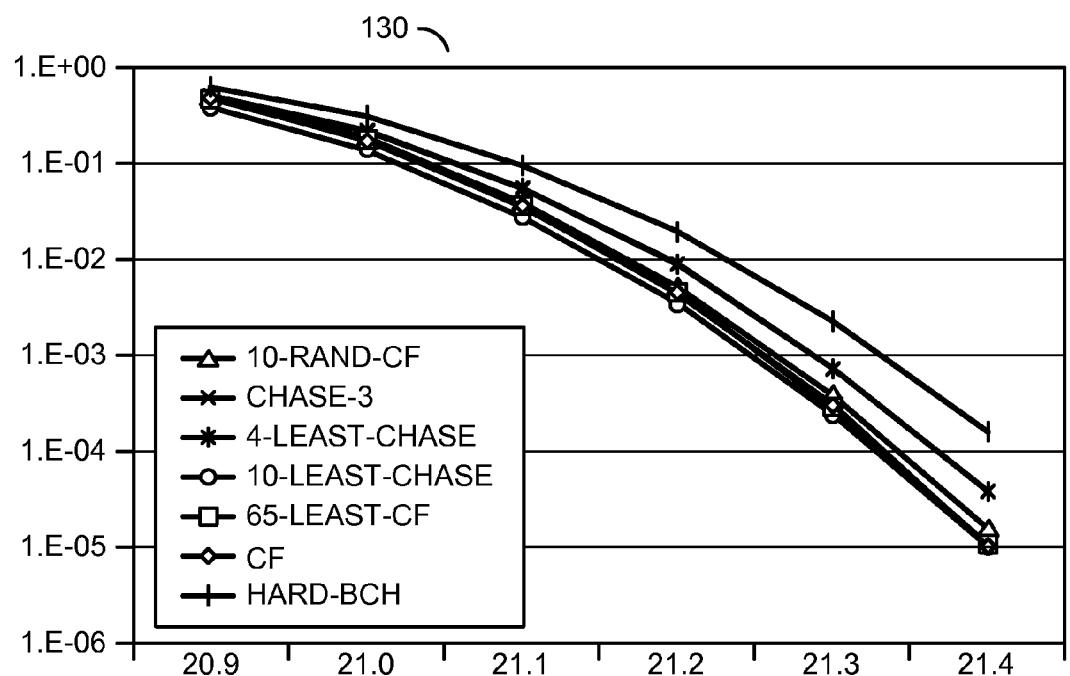
FIG. 4 is a diagram of an experimental word error rate simulation graph.

Referring to FIG. 4, a diagram of an experimental word error rate simulation graph 130 is shown. The graph 130 generally illustrates that some coin-flipping (e.g., CF) decoder techniques have up to an approximately 10-times smaller word error rate (e.g., Y-axis) over a range of signal-to-noise ratios (e.g., X-axis) than the standard hard-decision BCH decoder.

Figure 5:
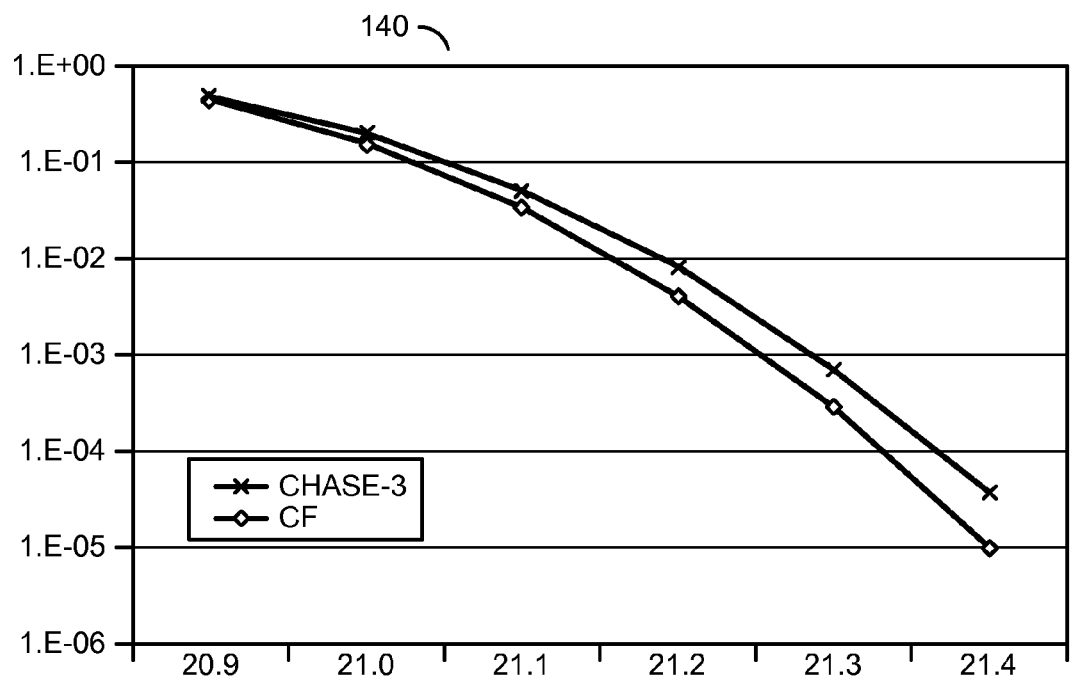
FIG. 5 is a diagram of an additional experimental word error rate simulation graph.

Referring to FIG. 5, a diagram of additional experimental word error rate simulation graph 140 is shown. The graph 140 illustrates that the coin-flipping decoder technique has a better (e.g., lower) word error rate performance than the Chase-3 decoding technique.

Figure 6:
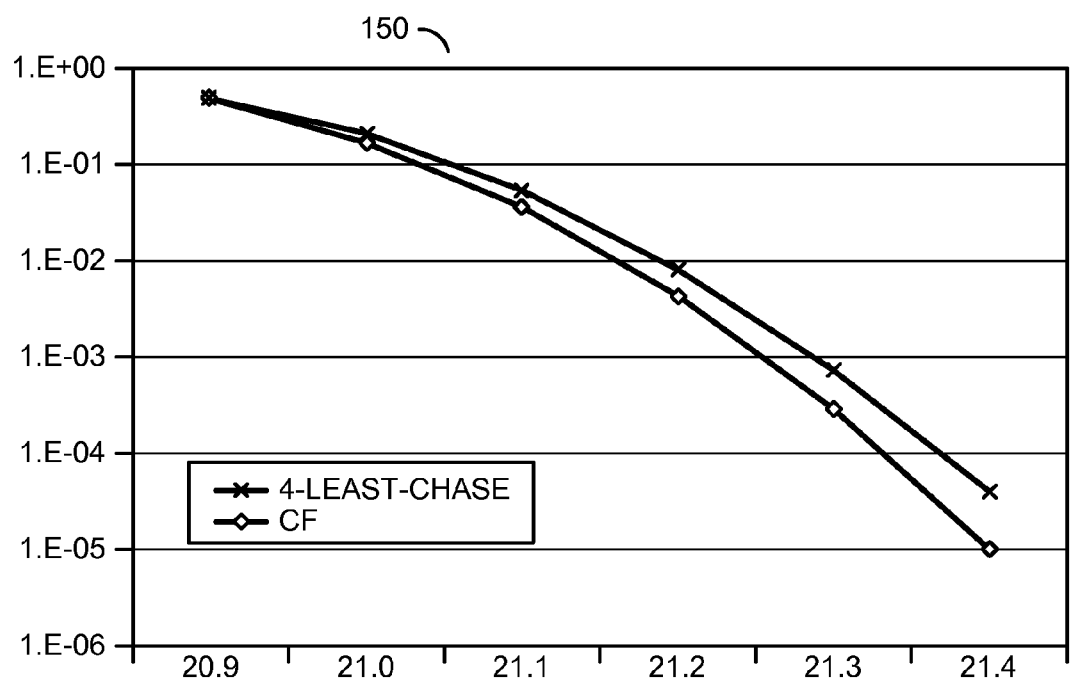
FIG. 6 is a diagram of another experimental word error rate simulation graph.

Referring to FIG. 6, a diagram of another experimental word error rate simulation graph 150 is shown. The graph 150 illustrates that the coin-flipping decoder technique has a better word error rate performance than the 4-least-Chase decoding technique.

Figure 7:
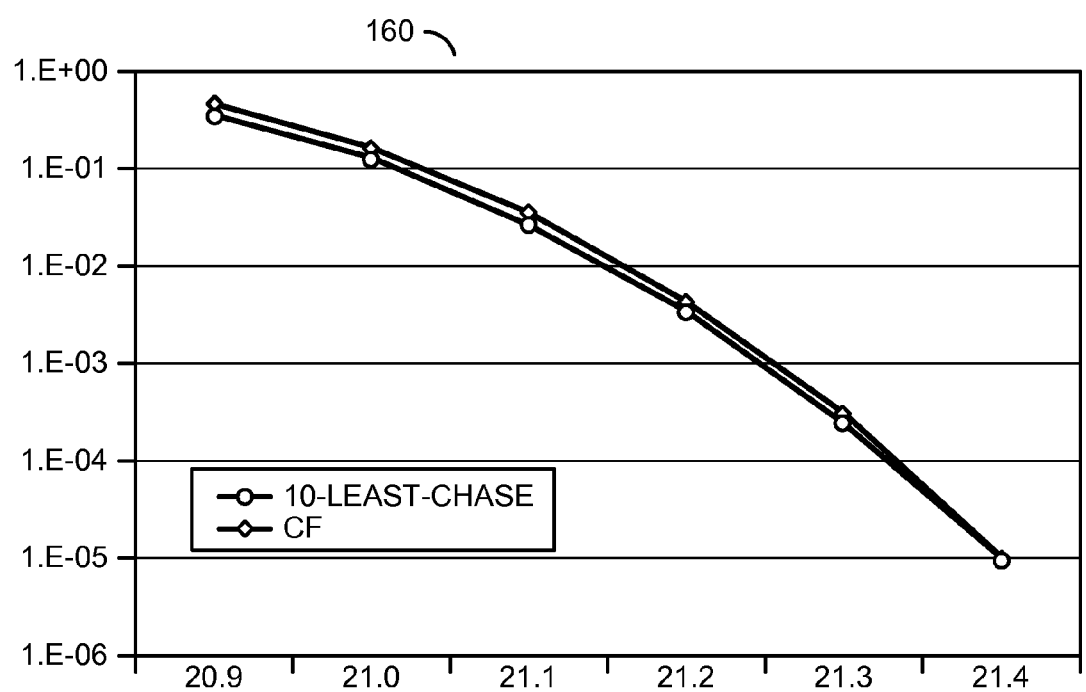
FIG. 7 is a diagram of an experimental word error rate simulation graph.

Referring to FIG. 7, a diagram of an experimental word error rate simulation graph 160 is shown. The graph 160 illustrates that the coin-flipping decoder technique works approximately the same as the 10-least-Chase decoder. In the 10-least-Chase decoder, the BCH decoder is run 1024 times instead of 16+1=17 times in the coin-flipping decoder. The simulations also indicate that a 65-least-CF modification of the coin-flipping decoder works approximately the same as the 10-least Chase decoder.

Various embodiments of the circuit 100 iteratively apply different test patterns to a received codeword and subsequently run an algebraic decoder on the adjusted codeword. In each iteration round, a next test pattern is generated randomly and, in some embodiments, independently of previous rounds instead of using a predefined collection of test patterns. The probability distribution used to produce a test pattern is defined by the input soft-decision information. Simulations have shown that the coin-flipping decoding technique provides additional coding gain compared with the standard hard-input decoding techniques and the soft-input Chase decoding techniques.

The functions performed by the diagrams of FIGS. 1-3 may be implemented using one or more of a conventional general purpose processor, digital computer, microprocessor, microcontroller, RISC (reduced instruction set computer) processor, CISC (complex instruction set computer) processor, SIND (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPS (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a memory configured to store data; and
   a controller configured to receive a codeword from the memory, determine a plurality of log-likelihood ratios of the codeword in response to a failure to decode the codeword using a hard-decision decoding, determine one or more least-reliable bit positions in the codeword based on the log-likelihood ratios, generate a trial codeword by selecting at random a respective value in one or more trial positions among the least-reliable bit positions in the codeword, and perform the hard-decision decoding on the trial codeword.

2. The apparatus according to claim 1, wherein the log-likelihood ratios are obtained via a plurality of reads of the codeword from the memory at a plurality of reference voltages.

3. The apparatus according to claim 1, wherein the controller is further configured to generate the log-likelihood ratios.

4. The apparatus according to claim 1, wherein the selection of the respective value of a particular one of the trial positions is weighted based on a corresponding one of the log-likelihood ratios.

5. The apparatus according to claim 1, wherein the controller is further configured to iterate a selection of the trial positions, the generation of the trial codeword, and the hard-decision decoding of the trial codeword until an end condition is reached.

6. The apparatus according to claim 5, wherein the end condition comprises a successful decoding of a current iteration of the trial codeword.

7. The apparatus according to claim 1, wherein the hard-decision decoding comprises one of a low density parity check decoding, a Bose-Chaudhuri-Hocquenghem decoding, and a Reed-Solomon decoding.

8. The apparatus according to claim 1, wherein the least-reliable bit positions are determined by comparing the log-likelihood ratios of the codeword to a threshold.

9. The apparatus according to claim 1, wherein the memory and the controller form part of a solid-state drive.

10. A method of decoding based on randomized hard decisions, comprising the steps of:
    receiving a codeword at a controller from a memory;
    determining a plurality of log-likelihood ratios of the codeword in response to a failure to decode the codeword using a hard-decision decoding;
    determining one or more least-reliable bit positions in the codeword based on the log-likelihood ratios;
    generating a trial codeword by selecting at random a respective value in one or more trial positions among the least-reliable bit positions in the codeword; and
    performing the hard-decision decoding on the trial codeword.

11. The method according to claim 10, further comprising the step of:
    generating the log-likelihood ratios in the controller.

12. The method according to claim 10, wherein the selection of the respective value of a particular one of the trial positions is weighted based on a corresponding one of the log-likelihood ratios.

13. The method according to claim 10, further comprising the step of:
    iterating a selection of the trial positions, the generation of the trial codeword, and the hard-decision decoding of the trial codeword until an end condition is reached.

14. The method according to claim 13, wherein the end condition comprises a successful decoding of a current iteration of the trial codeword.

15. The method according to claim 10, wherein the hard-decision decoding comprises one of a low density parity check decoding, (ii) a Bose-Chaudhuri-Hocquenghem decoding, and (iii) a Reed-Solomon decoding.

16. The method according to claim 10, further comprising the step of:
    selecting the trial positions in an ascending order of reliability from a predetermined number of the least-reliable bit positions.

17. The method according to claim 10, further comprising the step of:
    selecting the trial positions at random from a predetermined number of the least-reliable bit positions.

18. An apparatus comprising:
    an interface configured to process a plurality of read/write operations to/from a memory; and
    a control circuit configured to receive a codeword from the memory via the interface, determine a plurality of log-likelihood ratios of the codeword in response to a failure to decode the codeword using a hard-decision decoding, determine one or more least-reliable bit positions in the codeword based on the log-likelihood ratios, generate a trial codeword by selecting at random a respective value in one or more trial positions among the least-reliable bit positions in the codeword, and perform the hard-decision decoding on the trial codeword.

19. The apparatus according to claim 18, wherein the interface and the control circuit are part of a solid-state drive.

20. The method according to claim 10, wherein the steps are performed in a solid-state drive.

* * * * *

UNITED STATES PATENT AND TRADEMARK OFFICE
CERTIFICATE OF CORRECTION

PATENT NO. : 9,553,612 B2
APPLICATION NO. : 14/607492
DATED : January 24, 2017
INVENTOR(S) : Anatoli A. Bolotov et al.

It is certified that error appears in the above-identified patent and that said Letters Patent is hereby corrected as shown below:

In the Claims

Column 12, Claim 15, Line 3, delete "(ii)".

Column 12, Claim 15, Line 4, delete "(iii)".

Signed and Sealed this
Twenty-third Day of May, 2017

Michelle K. Lee
*Director of the United States Patent and Trademark Office*